(12) United States Patent
Choi

(10) Patent No.: US 11,581,590 B2
(45) Date of Patent: Feb. 14, 2023

(54) APPARATUS AND METHOD FOR DIAGNOSING INSULATION CONDITION BETWEEN BATTERY PACK AND GROUND, AND BATTERY PACK INCLUDING THE APPARATUS

(71) Applicant: LG Chem, Ltd., Seoul (KR)

(72) Inventor: Jin-Hwee Choi, Daejeon (KR)

(73) Assignee: LG Energy Solution, Ltd.

( * ) Notice: Subject to any disclaimer, the term of this patent is extended or adjusted under 35 U.S.C. 154(b) by 328 days.

(21) Appl. No.: 16/765,531

(22) PCT Filed: Aug. 27, 2019

(86) PCT No.: PCT/KR2019/010956
§ 371 (c)(1),
(2) Date: May 20, 2020

(87) PCT Pub. No.: WO2020/045968
PCT Pub. Date: Mar. 5, 2020

(65) Prior Publication Data
US 2020/0313248 A1      Oct. 1, 2020

(30) Foreign Application Priority Data

Aug. 27, 2018   (KR) ........................ 10-2018-0100607

(51) Int. Cl.
*H01M 10/48*       (2006.01)
*G01R 31/385*     (2019.01)
(Continued)

(52) U.S. Cl.
CPC ............ *H01M 10/48* (2013.01); *B60L 58/10* (2019.02); *G01R 31/371* (2019.01);
(Continued)

(58) Field of Classification Search
CPC ....... B60L 58/10; G01R 19/165; G01R 27/18; G01R 31/12; G01R 31/14; G01R 31/371;
(Continued)

(56) References Cited

U.S. PATENT DOCUMENTS

2003/0137319 A1    7/2003   Furukawa
2007/0285102 A1   12/2007   Muller
(Continued)

FOREIGN PATENT DOCUMENTS

CN   101779133 A    7/2010
CN   101806863 A    8/2010
(Continued)

OTHER PUBLICATIONS

International Search Report for PCT/KR2019/010956 dated Dec. 27, 2019; 3 pages.

(Continued)

*Primary Examiner* — Victoria H Lynch
(74) *Attorney, Agent, or Firm* — Lerner, David, Littenberg, Krumholz & Mentlik, LLP

(57) ABSTRACT

An apparatus for diagnosing an insulation condition between a battery pack and the ground includes a first resistor element electrically connected between a positive terminal of the battery pack and the ground, and a control circuit. The control circuit records a current flowing through the first test port as a first test current, while a high-level voltage is being applied between the positive terminal and the ground. The controller diagnoses the insulation condition between the battery pack and the ground, based on the first test current.

13 Claims, 3 Drawing Sheets

(51) Int. Cl.
*G01R 31/371* (2019.01)
*B60L 58/10* (2019.01)
*H01M 10/42* (2006.01)

(52) U.S. Cl.
CPC ...... *G01R 31/386* (2019.01); *H01M 10/4257* (2013.01); *H01M 10/4285* (2013.01); *H01M 2010/4271* (2013.01); *H01M 2010/4278* (2013.01)

(58) Field of Classification Search
CPC ............ G01R 31/386; H01M 10/4257; H01M 10/4285; H01M 10/48; H01M 2010/4271; H01M 2010/4278; H01M 50/20; Y02E 60/10; Y02T 10/70
See application file for complete search history.

(56) References Cited

U.S. PATENT DOCUMENTS

| | | | |
|---|---|---|---|
| 2009/0096464 | A1 | 4/2009 | Tanaka et al. |
| 2010/0237872 | A1 | 9/2010 | Kang et al. |
| 2011/0115490 | A1* | 5/2011 | Klijn ............ G01R 31/3835 324/433 |
| 2011/0199223 | A1 | 8/2011 | Akimov et al. |
| 2012/0016613 | A1 | 1/2012 | Yang et al. |
| 2013/0176041 | A1 | 7/2013 | Yang |
| 2013/0176042 | A1 | 7/2013 | Huh |
| 2014/0035594 | A1 | 2/2014 | Kamata et al. |
| 2014/0039740 | A1 | 2/2014 | Kwon et al. |
| 2014/0084933 | A1 | 3/2014 | Jang et al. |
| 2014/0159908 | A1 | 6/2014 | Hong et al. |
| 2014/0214262 | A1 | 7/2014 | Iwanabe et al. |
| 2016/0096433 | A1 | 4/2016 | Gale et al. |
| 2017/0160327 | A1 | 6/2017 | Jung et al. |
| 2017/0176512 | A1 | 6/2017 | Pritelli et al. |
| 2018/0154776 | A1* | 6/2018 | Gardien ............ G01R 31/52 |
| 2018/0188326 | A1 | 7/2018 | Huh et al. |

FOREIGN PATENT DOCUMENTS

| | | |
|---|---|---|
| CN | 102171578 A | 8/2011 |
| CN | 103688183 A | 3/2014 |
| CN | 103969543 A | 8/2014 |
| CN | 104220887 A | 12/2014 |
| CN | 105486923 A | 4/2016 |
| CN | 205880165 U | 1/2017 |
| CN | 206096402 U | 4/2017 |
| CN | 106896274 A | 6/2017 |
| CN | 106990275 A | 7/2017 |
| CN | 107850643 A | 3/2018 |
| CN | 108076658 A | 5/2018 |
| CN | 108303588 A | 7/2018 |
| JP | H11306984 A | 11/1999 |
| JP | 2009093822 A | 4/2009 |
| JP | 2013024694 A | 2/2013 |
| JP | 2015215163 A | 12/2015 |
| JP | 2018127085 A | 8/2018 |
| KR | 19970071029 | 11/1997 |
| KR | 20010019993 A | 3/2001 |
| KR | 20090015330 A | 2/2009 |
| KR | 20090131961 A | 12/2009 |
| KR | 20100105962 A | 10/2010 |
| KR | 101236606 B1 | 2/2013 |
| KR | 20130080579 A | 7/2013 |
| KR | 20140055186 A | 5/2014 |
| KR | 101470552 B1 | 12/2014 |

OTHER PUBLICATIONS

Chen, Z. et al., "Active detection system of insulation resistance in electric vehicle," Journal of Electronic Measurement and Instrument May 2013, pp. 409-414, vol. 27, No. 5. (Providing English Translation of Abstract only).

Li, J. et al., "Research on insulation resistance on-line monitoring for electric vehicle," International Conference on Electrical Machines and Systems, Sep. 2005, pp. 814-817.

Search Report dated Dec. 7, 2021 from the Office Action for Chinese Application No. 201980006541.6 dated Dec. 14, 2021, pp. 1-5.

Xin, Z. et al., "Study on insulation detection method of electric vehicles based on single point of failure model," Power Engineering and Renewable Energy Technologies, Jun. 2016, pp. 191-194.

Xingye, Z. et al., "Resistance detection method of battery pack dynamic insulation of hybrid power automoblie," Mordern Electronics Technique, May 2017, pp. 121-124, vol. 40, No. 10. (Providing English Translation of Abstract only).

European Search Report for Application No. EP 19854346, dated Nov. 18, 2020, 11 pages.

* cited by examiner

APPARATUS AND METHOD FOR DIAGNOSING INSULATION CONDITION BETWEEN BATTERY PACK AND GROUND, AND BATTERY PACK INCLUDING THE APPARATUS

CROSS-REFERENCE TO RELATED APPLICATIONS

The present application is a national phase entry under 35 U.S.C. § 371 of International Application No. PCT/KR2019/010956 filed Aug. 27, 2019, published in Korean, which claims priority from Korean Patent Application No. 10-2018-0100607 filed Aug. 27, 2018, all of which are incorporated herein by reference.

TECHNICAL FIELD

The present disclosure relates to an apparatus and method for diagnosing an insulation condition between a battery pack and the ground, and a battery pack including the apparatus.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Currently commercially available battery packs include rechargeable power storage devices such as nickel cadmium batteries, nickel hydrogen batteries, nickel zinc batteries, lithium ion batteries and the like. In particular, in case of a battery pack applied to a large electric product requiring high voltage such as an electric vehicle, if the insulation between the battery pack and the ground is not maintained completely, peripheral circuits may malfunction and also there is a great risk of electric shock or the like.

Patent Literature 1 discloses a circuit for measuring an insulation resistance between the battery pack and the ground. However, Patent Literature 1 uses only a pack voltage, which is a voltage across the battery pack, so that the accuracy of diagnosis of the insulation condition is not high.

(Patent Literature1) Korean Unexamined Patent Publication No. 10-2010-0105962 (publication date: Oct. 1, 2010)

SUMMARY

Technical Problem

The present disclosure is designed to solve the problems of the related art, and therefore the present disclosure is directed to providing an apparatus and method for more accurately diagnosing an insulation condition between a battery pack and the ground by applying a high-level voltage between a positive terminal of the battery pack and the ground or between a negative terminal of the battery pack and the ground using a power supply that supplies a DC voltage separately from the battery pack, and a battery pack including the apparatus.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

Various embodiments of the present disclosure for achieving the above object are as follows.

An apparatus for diagnosing an insulation condition between a battery pack and a ground according to an embodiment of the present disclosure comprises: a first resistor element electrically connected between a positive terminal of the battery pack and the ground; and a control circuit including a power supply and a controller operably coupled to the power supply. The power supply includes a first test port electrically connected to the positive terminal and a second test port electrically connected to the ground and is configured to generate a high-level voltage. The controller is configured to command the power supply to apply the high-level voltage between the first test port and the second test port for a first predetermined period from a first time point. The controller is configured to record a first current flowing through the first test port within the first predetermined period from the first time point as a first test current. The controller is configured to diagnose an insulation condition between the battery pack and the ground, based on the first test current.

The controller may be configured to calculate a first test resistance by dividing the high-level voltage by the first test current. If the first test resistance is smaller than a first reference resistance by a first threshold resistance or more, the controller may be configured to output a first reporting message to an external device operably coupled to the controller through a communication channel, the first reporting indicating that the insulation condition between the battery pack and the ground is faulty.

The apparatus may further comprise a second resistor element electrically connected between a negative terminal of the battery pack and the ground. The first resistor element and the second resistor element may have a same resistance. The power supply may further include a third test port electrically connected to the negative terminal.

The controller may be configured to control the power supply to apply the high-level voltage between the third test port and the second test port for a second predetermined period from a second time point. The controller may be configured to record a second current flowing through the third test port within the second predetermined period from the second time point as a second test current. The controller may be configured to diagnose the insulation condition between the battery pack and the ground, based on the second test current.

The controller may be configured to calculate a second test resistance by dividing the high-level voltage by the second test current. If the second test resistance is smaller than a second reference resistance by a second threshold resistance or more, the controller may be configured to output a first reporting message to an external device operably coupled to the controller through a communication channel, the first reporting message indicating that the insulation condition between the battery pack and the ground is faulty.

The controller may be configured to record a voltage between the first test port and the third test port as a pack voltage.

The high-level voltage may be greater than ½ of the pack voltage.

The controller may be configured to record a first test voltage between the first test port and the second test port while the power supply is in a sleep state. The controller may be configured to record a second test voltage between the second test port and the third test port while the power supply is in the sleep state. The controller may be configured to determine whether a first insulation resistance between the positive terminal and the ground and a second insulation resistance between the negative terminal and the ground are in an unbalanced condition, based on the first test voltage, the second test voltage and the pack voltage.

A battery pack according to another embodiment of the present disclosure comprises the apparatus of any of the embodiments described herein.

A method for diagnosing an insulation condition between a battery pack and a ground according to another embodiment of the present disclosure uses an apparatus comprising a first resistor element electrically connected between a positive terminal of the battery pack and the ground; and a control circuit including a power supply and a controller operably coupled to the power supply, wherein the power supply includes a first test port electrically connected to the positive terminal and a second test port electrically connected to the ground and is configured to generate a high-level voltage. The method comprises: by the controller, controlling the power supply to apply the high-level voltage between the first test port and the second test port for a first predetermined period from a first time point; by the controller, recording a first current flowing through the first test port within the first predetermined period from the first time point as the first test current; and by the controller, determining whether the insulation condition between the battery pack and the ground is faulty, based on the first test current.

The method may further comprise: by the controller, controlling the power supply to apply the high-level voltage between a third test port included in the power supply and the second test port for a second predetermined period from a second time point, wherein the third test port is electrically connected to a negative terminal of the battery pack; by the controller, recording a second current flowing through the third test port within the second predetermined period from the second time point as a second test current; and by the controller, determining whether the insulation condition between the battery pack and the ground is faulty, based on the second test current.

Advantageous Effects

According to at least one of the embodiments of the present disclosure, since a high-level voltage is applied between a positive terminal of the battery pack and the ground or between a negative terminal of the battery pack and the ground using a power supply that supplies a DC voltage separately from the battery pack, it is possible to more accurately diagnose an insulation condition between the battery pack and the ground.

The effects of the present disclosure are not limited to the above, and other effects not mentioned herein will be clearly understood by those skilled in the art from the appended claims.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise. Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Figure 1:
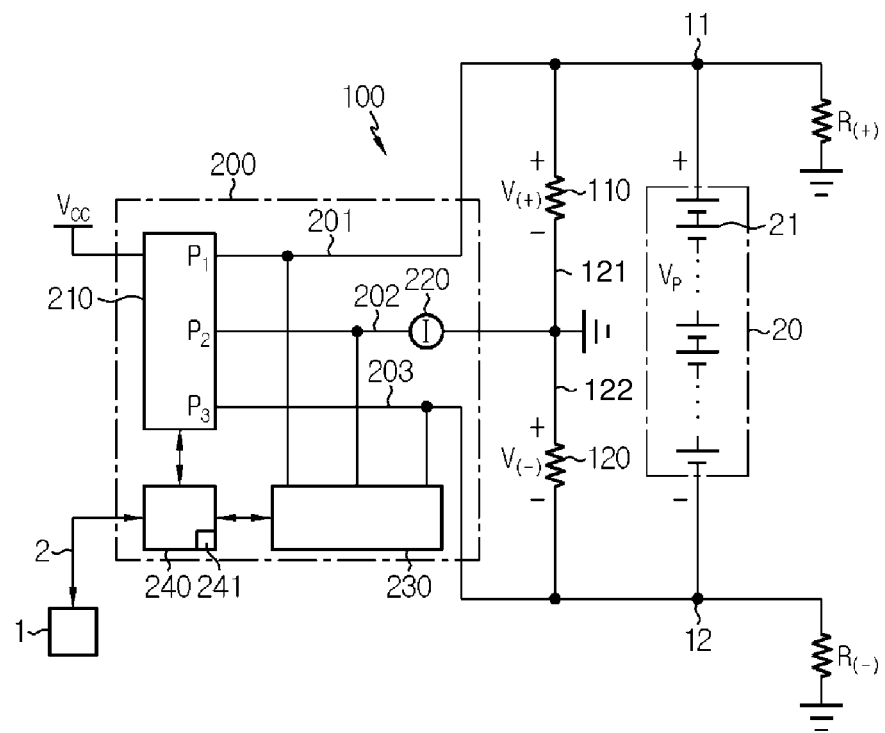
FIG. 1 is a diagram exemplarily showing a battery pack including an apparatus for diagnosing an insulation condition between the battery pack and the ground according to an embodiment of the present disclosure.

FIG. 1 is a diagram exemplarily showing a battery pack 10 including an apparatus 100 for diagnosing an insulation condition between the battery pack 10 and the ground according to an embodiment of the present disclosure.

Referring to FIG. 1, the battery pack 10 includes a positive terminal 11, a negative terminal 12, a battery 20, and an apparatus 100. The positive terminal 11 is electrically connected to a highest potential node of the battery 20. The negative terminal 12 is electrically connected to a lowest potential node of the battery 20.

The battery 20 includes at least one unit cell 21. The unit cell 21 is not particularly limited as long as it is rechargeable, like a lithium ion cell.

In FIG. 1, $R_{(+)}$ represents a first insulation resistance that depends on an insulation condition between the positive terminal 11 and the ground. $R_{(-)}$ represents a second insulation resistance that depends on an insulation condition between the negative terminal 12 and the ground. The ground may be a chassis of a power device (for example, an electric vehicle) to which the battery pack 10 may be mounted.

The apparatus 100 includes at least one of the first resistor element 110 and the second resistor element 120. The apparatus 100 further includes a control circuit 200. Hereinafter, the apparatus 100 will be described as including both the first resistor element 110 and the second resistor element 120.

The first resistor element 110 is electrically connected between the positive terminal 11 of the battery 20 and the ground. For example, the first resistor element 110 may be included in an electrical line 121 that electrically connects the positive terminal 11 of the battery 20 and the ground.

The second resistor element 120 is electrically connected between the negative terminal 12 of the battery 20 and the ground. For example, the second resistor element 120 may be included in an electrical line 122 that electrically connects the negative terminal 12 of the battery 20 and the ground. Hereinafter, it is assumed that the first resistor element 110 and the second resistor element 120 have the same resistance. In this case, a series circuit formed by the first resistor element 110 and the second resistor element 120 functions as a voltage divider that bisects the voltage of the battery 20 with respect to the ground.

The control circuit 200 includes a power supply 210, a current sensor 220 and a controller 240. The control circuit 200 may further include a voltage measuring unit 230.

The power supply 210 includes a first test port ($P_1$), a second test port ($P_2$) and a third test port ($P_3$). The first test port ($P_1$) is electrically connected to the positive terminal 11 of the battery 20 through an electrical line 201. The second test port ($P_2$) is electrically connected to the ground through an electrical line 202. The third test port ($P_3$) is electrically connected to the negative terminal 12 of the battery 20 through an electrical line 203.

The power supply 210 is configured to apply a high-level voltage having magnitude and polarity required by a command message between any two of the first test port ($P_1$), the second test port ($P_2$) and the third test port ($P_3$), in response to the command message from the controller 240. The power supply 210 may convert an input voltage ($V_{CC}$) from an external power source to generate a high-level voltage ($V_H$, see FIGS. 2 and 3).

The current sensor 220 detects a current flowing through at least one of the first test port ($P_1$), the second test port ($P_2$) and the third test port ($P_3$) and generates current data indicating the detected current. For example, as shown in FIG. 1, the current sensor 220 may be installed on the electrical line 202 that connects the second test port ($P_2$) and the ground.

The voltage measuring unit 230 includes at least one voltage sensor. The voltage measuring unit 230 is electrically connected to the first test port ($P_1$), the second test port ($P_2$) and the third test port ($P_3$) and is configured to generate at least one of first voltage data, second voltage data and third voltage data. The first voltage data represents a voltage ($V_{(+)}$) between the first test port ($P_1$) and the second test port ($P_2$). The second voltage data represents a voltage ($V_{(-)}$) between the second test port ($P_2$) and the third test port ($P_3$). The third voltage data represents a voltage ($V_P$) between the first test port ($P_1$) and the third test port ($P_3$).

In hardware, the controller 240 may be implemented to include at least one of application specific integrated circuits (ASICs), digital signal processors (DSPs), digital signal processing devices (DSPDs), programmable logic devices (PLDs), field programmable gate arrays (FPGAs), microprocessors, other electrical units for performing other functions. In addition, the controller 240 may include a memory device 241 included therein, and the memory device 241 may employ, for example, a RAM, a ROM, a register, a hard disk, an optical recording medium, or a magnetic recording medium. The memory device 241 may store, update and/or erase a program including various control logics executed by the controller 240 and/or data generated when the control logics are executed. The controller 240 is operably coupled to the power supply 210, the current sensor 220, the voltage measuring unit 230 and an external device 1. The controller 240 communicates with the external device 1 through a communication channel 2. The communication channel 2 supports wired or wireless communication. The wired communication may be, for example, a controller area network (CAN) communication, and the wireless communication may be, for example, ZigBee or Bluetooth communication. The type of communication protocol is not particularly not limited as long as it supports wired and wireless communication between the controller 240 and the external device 1.

The control circuit 200 may be configured to execute one or more diagnosing operations one by one so as not to overlap each other. That is, the controller 240 may execute a plurality of diagnosing operations at different time points. Hereinafter, it is assumed that three diagnosing operations, namely a preparatory diagnosing operation, a first main diagnosing operation and a second main diagnosing operation, are executed in order by the control circuit 200. The preparatory diagnosing operation may be omitted as needed. The first main diagnosing operation and the second main diagnosing operation may be executed so that their execution periods do not overlap each other, and their order is not particularly limited.

<Preparatory Diagnosing Operation>

First, the preparatory diagnosing operation will be described. In the preparatory diagnosing operation, the controller 240 primarily diagnoses whether the insulation condition between the positive terminal 11 and the ground or between the negative terminal 12 and the ground is unbalanced while the power supply 210 is controlled into a sleep state by the controller 240. In the sleep state, the power supply 210 stops generating a high-level voltage.

When the preparatory diagnosing operation is executed, the controller 240 collects first voltage data, second voltage data and third voltage data from the voltage measuring unit 230. The first voltage data corresponds to a voltage ($V_{(+)}$) applied to both ends of the first resistor element 110. The second voltage data corresponds to a voltage ($V_{(-)}$) applied to both ends of the second resistor element 120. The third voltage data corresponds to a voltage (i.e., a pack voltage $V_P$) applied between the positive terminal 11 and the negative terminal 12. The controller 240 may record $V_{(+)}$ in the memory device 241 as a first test voltage, record $V_{(-)}$ in the memory device 241 as a second test voltage, and record $V_P$ in the memory device 241 as the pack voltage.

The controller 240 determines (i) whether the difference between the first test voltage and the second test voltage is smaller than a first threshold voltage, and (ii) whether the difference between the sum of the first test voltage and the second test voltage and the pack voltage is smaller than a second threshold voltage, simultaneously or sequentially.

If the difference between the first test voltage and the second test voltage is greater than or equal to the first threshold voltage or the difference between the sum of the first test voltage and the second test voltage and the pack voltage is greater than or equal to the second threshold voltage, this represents that at least one of the insulation condition between the positive terminal 11 and the ground and the insulation condition between the negative terminal 12 and the ground is faulty, and also represents that the insulation condition between the positive terminal 11 and the ground and the insulation condition between the negative terminal 12 and the ground are unbalanced.

As a result of the preparatory diagnosing operation, if the insulation condition between the positive terminal 11 and the ground and the insulation condition between the negative terminal 12 and the ground are unbalanced, the controller 240 may execute at least one of the first main diagnosing operation and the second main diagnosing operation, explained later.

Figure 2:
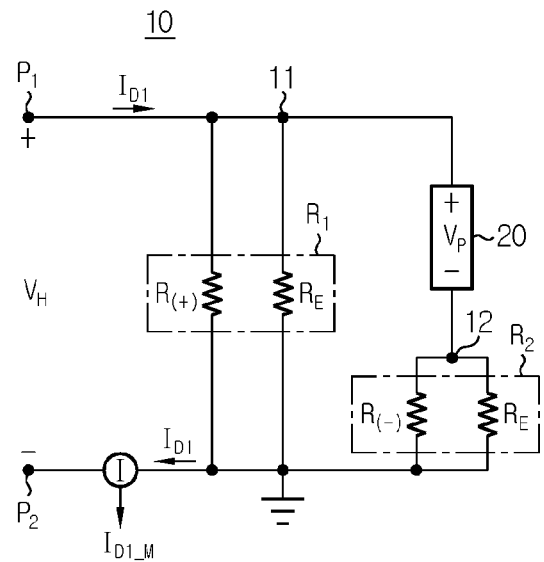
FIG. 2 is a diagram for illustrating a first main diagnosing operation, executed by the apparatus of FIG. 1.

FIG. 2 is a diagram that is referred to in explaining the first main diagnosing operation executed by the apparatus 100 of FIG. 1. In FIG. 2, $R_E$ is a resistance of the first resistor element 110 (or the second resistor element 120).

The controller 240 executes the first main diagnosing operation at any time point where the preparatory diagnosing operation and the second main diagnosing operation are not executed.

Referring to FIGS. 1 and 2, when the first main diagnosing operation is executed, the controller 240 transmits a command message, which requests to apply a high-level voltage ($V_H$) between the first test port ($P_1$) and the second test port ($P_2$), to the power supply 210. Accordingly, the power supply 210 applies the high-level voltage ($V_H$) between the first test port ($P_1$) and the second test port ($P_2$) for a predetermined period.

Accordingly, while the first main diagnosing operation is executed, a current ($I_{D1}$) flows through the first test port ($P_1$). The current sensor 220 transmits current data ($I_{D1\_M}$) representing the current ($I_{D1}$) flowing through the first test port ($P_1$) to the controller 240.

The current ($I_{D1}$) may be expressed as in Equation 1 below.

$$I_{D1} = \frac{V_H(R_1 + R_2) - V_P R_2}{R_1 R_2} \qquad <\text{Equation 1}>$$

In Equation 1, $R_1$ represents a resultant resistance of $R_{(+)}$ and $R_E$. $R_2$ represents a resultant resistance of $R_{(-)}$ and $R_E$. Namely, $R_1$ represents a resistance in the case where $R_{(+)}$ and $R_E$ are connected in parallel, and $R_2$ represents a resistance in the case where $R_{(-)}$ and $R_E$ are connected in parallel. In addition, $V_P$ is the pack voltage, and $V_H$ is the high-level voltage.

If the insulation condition between the battery pack 10 and the ground is faulty, this means that $R_1$ decreases compared to the resistance ($R_E$) of the first resistor element 110 by a certain level or more, or means that $R_2$ decreases compared to the resistance ($R_E$) of the second resistor element 120 by a certain level or more.

Meanwhile, if the insulation condition between the battery pack 10 and the ground is good, first insulation resistance ($R_{(+)}$) and second insulation resistance ($R_{(-)}$) would be very large compared to the resistance ($R_E$), and thus $R_1$ and $R_2$ may be treated as being identical to the resistance ($R_E$) of the first resistor element 110. Thus, Equation 1 may be simplified into Equation 2 below.

$$I_{D1\_R} = \frac{2V_H - V_P}{R_E} \qquad <\text{Equation 2}>$$

In Equation 2, since $V_P$, $V_H$ and $R_E$ are values already known, $I_{D1\_R}$ of Equation 2 may be determined by the controller 240 as a first reference current or be stored in the memory device 241 of the controller 240 in advance. For example, it is assumed that $V_P$=324 [V], $V_H$=500 [V], and $R_E$=50 [MΩ]. Then, $I_{D1\_R}$=13.52 [μA].

As found in Equation 2, only when the high-level voltage ($V_H$) is greater than ½ of the pack voltage ($V_P$), $I_{D1\_R}$ has a positive value. Thus, when executing the first main diagnosing operation, the controller 240 may command the power supply 210 to output a voltage greater than ½ of the pack voltage ($V_P$) as the high-level voltage ($V_H$). As an alternative, the high-level voltage ($V_H$) may be set in the power supply 210 in advance, in consideration of the rated voltage of the battery pack 10.

Moreover, the controller 240 may determine the high-level voltage ($V_H$) according to a current offset of the current sensor 220. The current offset represents the measurement accuracy of the current sensor 220 and is predetermined in advance. Data representing the current offset may be stored in the memory device 241 in advance. Seeing Equation 1, the current ($I_{D1}$) is proportional to the high-level voltage ($V_H$). The controller 240 may read the current offset from the memory device 241 and determine the high-level voltage ($V_H$) based on the magnitude of the current offset. For example, the controller 240 may determine the first voltage (e.g., 400 [V]) as the high-level voltage ($V_H$) if the current offset is smaller than or equal to a predetermined reference value. As another example, if the current offset is greater than the reference value, the controller 240 may determine a second voltage (e.g., 550 [V]), obtained by increasing the first voltage by an amount corresponding to the difference between the current offset and the reference value, as the high-level voltage ($V_H$).

The controller 240 records a current ($I_{D1}$) flowing through the first test port ($P_1$) as the first test current, based on the current data ($I_{D1\_M}$) from the current sensor 220, within a predetermined period from the time point when the first main diagnosing operation is executed. Next, the controller 240 diagnoses the insulation condition between the battery pack 10 and the ground based on the first test current. For example, if the first test current is smaller than the first reference current by the first threshold current or more, the controller 240 may determine that the insulation condition between the battery pack 10 and the ground is faulty. The first threshold current is predetermined. As another example, if a ratio of the magnitude of the first test current to the magnitude of the first reference current is smaller than or equal to a first threshold ratio, the controller 240 may determine that the insulation condition between the battery pack 10 and the ground is faulty. The first threshold ratio is predetermined between 0 and 100% (e.g., 85%).

The controller 240 may calculate the first reference resistance by dividing the high-level voltage ($V_H$) by $I_{D1\_R}$, which is the first reference current. For example, it is assumed that $V_H$=500 [V] and $I_{D1\_R}$=13.52 [μA]. Then, the first reference resistance=36.98 [MΩ]. The controller 240 may calculate the first test resistance by dividing the high-level voltage ($V_H$) by the first test current ($I_{D1}$) and then determine that the insulation condition between the battery pack 10 and the ground is faulty if the first test resistance is smaller than a first threshold resistance by the first threshold resistance or more. The first threshold resistance is also predetermined and may correspond to the first threshold current and the first threshold ratio.

If the insulation condition between the battery pack 10 and the ground is determined as being faulty as a result of the execution of the first main diagnosing operation, the controller 240 may output a first reporting message, and in other cases, the controller 240 may output a second reporting message. The first reporting message is to notify the external device 1 that a short circuit has occured between the positive terminal 11 and the ground or between the negative terminal 12 and the ground. The external device 1 may be, for example, an electronic control unit (ECU) or a display device of an electric vehicle. The second reporting message is to notify the external device 1 that both of the insulation condition between the positive terminal 11 and the ground and the insulation condition between the negative terminal 12 and the ground are good. At least one of the first reporting message and the second reporting message may include data representing at least one of the first test current and the first test resistance. The display device may output information represented by the data included in the first reporting message and the second reporting message in a visual form.

Meanwhile, FIG. 2 shows that the potential of the first test port ($P_1$) is higher than the second test port ($P_2$) by the higher-level voltage ($V_H$), but vice versa. That is, the polarity of the high-level voltage ($V_H$) applied between the first test port ($P_1$) and the second test port ($P_2$) may be reversed.

Figure 3:
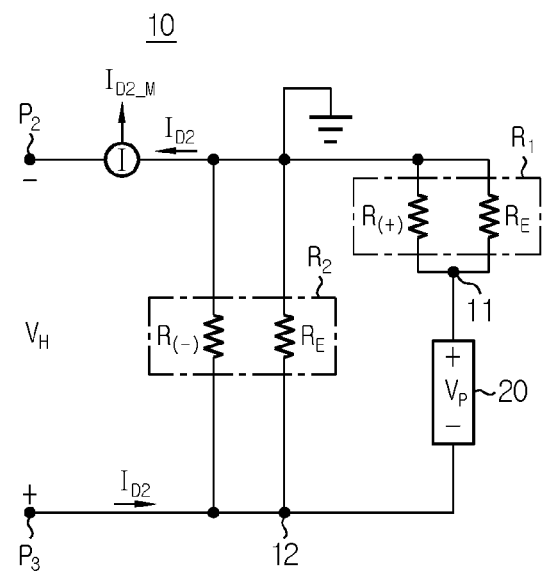
FIG. 3 is a diagram for illustrating a second main diagnosing operation, executed by the apparatus of FIG. 1.

FIG. 3 is a diagram for illustrating the second main diagnosing operation, performed by the apparatus 100 of FIG. 1.

The controller 240 executes the second main diagnosing operation at any time point where the preparatory diagnosing operation and the first main diagnosing operation are not executed.

Referring to FIGS. 1 and 3, when executing the second main diagnosing operation, the controller 240 transmits a command message, which requests to apply the high-level voltage ($V_H$) between the third test port ($P_3$) and the second test port ($P_2$), to the power supply 210. Accordingly, the power supply 210 applies the high-level voltage ($V_H$) between the third test port ($P_3$) and the second test port ($P_2$) for a predetermined period.

Thus, while the second main diagnosing operation is executed, a current ($I_{D2}$) flows through the third test port ($P_3$). The current sensor 220 transmits current data ($I_{D2\_M}$) representing the current ($I_{D2}$) flows through the third test port ($P_3$) to the controller 240.

The current ($I_{D2}$) may be expressed as in Equation 3 below.

$$I_{D2} = \frac{V_H(R_1 + R_2) + V_P R_2}{R_1 R_2} \qquad <\text{Equation 3}>$$

$R_1$, $R_2$, $V_P$, and $V_H$ of Equation 3 are identical to $R_1$, $R_2$, $V_P$, and $V_H$ of Equation 1.

If the insulation condition between the battery pack 10 and the ground is good, Equation may simplified into Equation 4 below.

$$I_{D2\_R} = \frac{2V_H + V_P}{R_E} \qquad <\text{Equation 4}>$$

$R_E$ of Equation 4 is identical to $R_E$ of Equation 2. $I_{D2\_R}$ of Equation 4 is a second reference current, which may be determined by the controller 240 or stored in advance in the memory device 241 of the controller 240. For example, it may be assumed that $V_P$=324 [V], $V_H$=500 [V], and $R_E$=50 [MΩ]. Then, $I_{D2\_R}$=26.48 [μA].

The controller 240 records the current ($I_{D2}$) flowing through the third test port ($P_3$) as a second test current, based on the current data ($I_{D2\_M}$) from the current sensor 220, within a predetermined period from the time point at which the second main diagnosing operation is executed. Next, the controller 240 diagnoses the insulation condition between the battery pack 10 and the ground based on the second test current. For example, if the second test current is smaller than the second reference current by a second threshold current or more, the controller 240 may determines that the insulation condition between the battery pack 10 and the ground is faulty. The second threshold current may be identical to the first threshold current, explained above. In another example, if a ratio of the magnitude of the second test current to the magnitude of the second reference current is smaller than or equal to a second threshold ratio, the controller 240 may determine that the insulation condition between the battery pack 10 and the ground is faulty. The second threshold ratio may be identical to the first threshold ratio, explained above.

The controller 240 may calculate the second reference resistance by dividing the high-level voltage ($V_H$) by $I_{D2\_R}$, which is the second reference current. For example, it is assumed that $V_H$=500 [V] and $I_{D2\_R}$=26.48 [μA]. Then, the second reference resistance=18.88 [MΩ]. The controller 240 may calculate the second test resistance by dividing the high-level voltage ($V_H$) by the second test current and then determine that the insulation condition between the battery pack 10 and the ground is faulty if the second test resistance is smaller than the second reference resistance by the second threshold resistance or more. The second threshold resistance may be identical to the first threshold resistance, explained above.

If the insulation condition between the battery pack 10 and the ground is determined as being faulty as a result of the execution of the second main diagnosing operation, the controller 240 may output the first reporting message, and in other cases, the controller 240 may output the second reporting message. At least one of the first reporting message and the second reporting message may include data indicating at least one of the second test current and the second test resistance.

Meanwhile, $R_1$ and $R_2$ are two unknown values common to Equations 1 and 3. In other words, Equations 1 and 3 are a pair of equations containing two common unknown values, $R_1$ and $R_2$. Thus, the controller 240 may determine $R_1$ and $R_2$ of Equations 1 and 3 by putting the first test current determined during the execution of the first main diagnosing operation into $I_{D1}$ of Equation 1 and putting the second test current determined during the execution of the second main diagnosing operation into $I_{D2}$ of Equation 3. If both the first main diagnosing operation and the second main vibration operation are executed by the controller 240, at least one of the first reporting message and the second reporting message may include data indicating $R_1$ and $R_2$ calculated by the controller 240.

If $R_1$ and $R_2$ are calculated, the controller 240 may calculate the first insulation resistance $R_{(+)}$ and the second insulation resistance $R_{(-)}$ by using Equations 5 and 6 below.

$$R_{(+)} = \frac{R_E R_1}{R_E - R_1} \qquad <\text{Equation 5}>$$

$$R_{(-)} = \frac{R_E R_2}{R_E - R_2} \qquad <\text{Equation 6}>$$

At least one of the first reporting message and the second reporting message may include data representing $R_{(+)}$ and $R_{(-)}$ calculated by the controller 240.

Meanwhile, FIG. 3 shows that the potential of the third test port ($P_3$) is higher by the high-level voltage ($V_H$) than the second test port ($P_2$), but vice versa. That is, the polarity of the high-level voltage ($V_H$) applied between the third test port ($P_3$) and the second test port ($P_2$) may be reversed.

Figure 4:
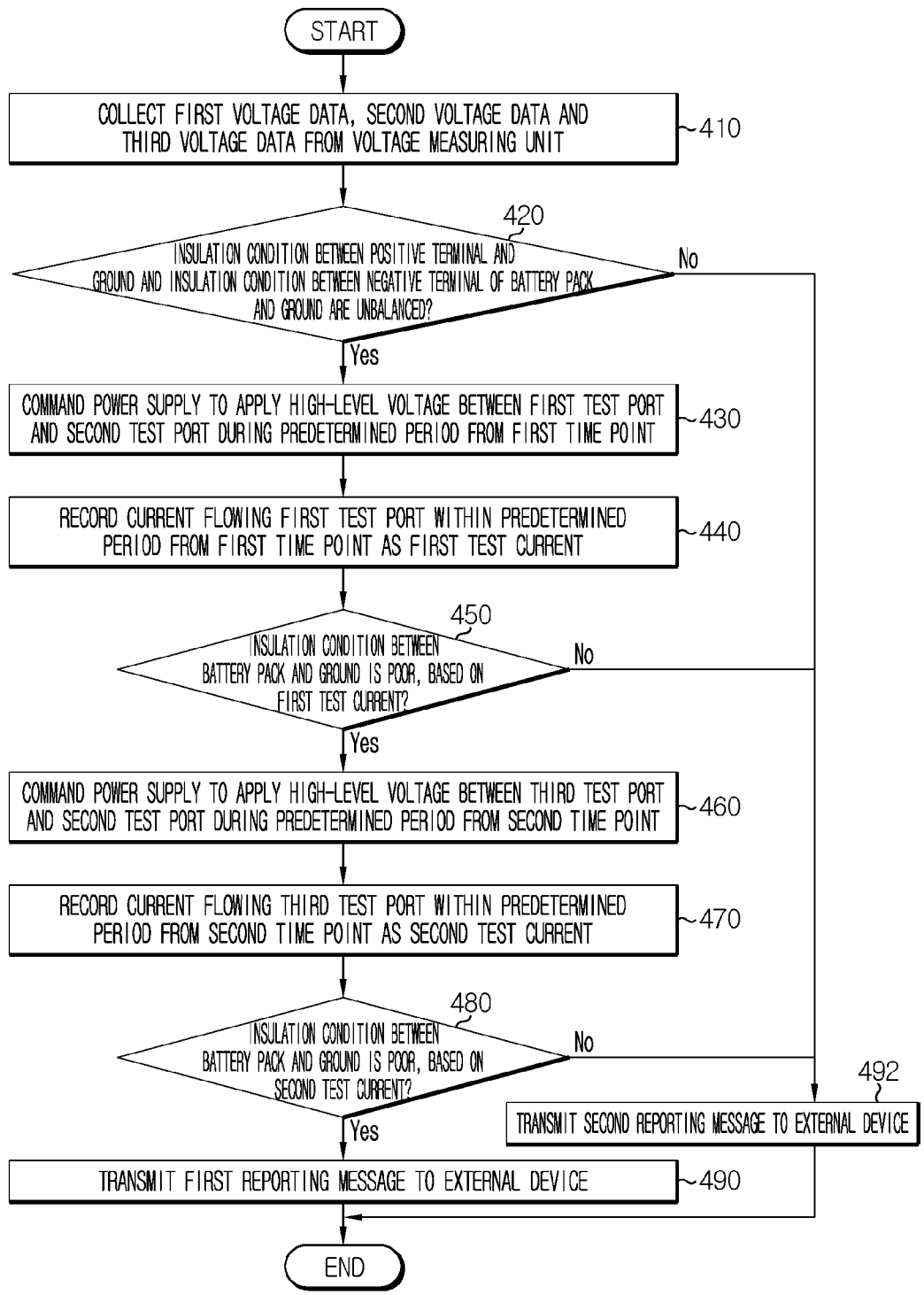
FIG. 4 is a flowchart for illustrating a method for diagnosing an insulation condition between the battery pack and the ground according to another embodiment of the present disclosure.

FIG. 4 is a flowchart for illustrating a method for diagnosing an insulation condition between the battery pack 10 and the ground according to another embodiment of the present disclosure.

Referring to FIGS. 1 to 4, in Step 410, the controller 240 collects first voltage data, second voltage data and third voltage data from the voltage measuring unit 230. The first voltage data corresponds to the voltage ($V_{(+)}$) between the positive terminal 11 and the ground. The second voltage data corresponds to the voltage ($V_{(-)}$) between the negative terminal 12 and the ground. The third voltage data corresponds to the pack voltage ($V_P$).

In Step 420, the controller 240 determines whether the insulation condition between the positive terminal 11 and the ground and the insulation condition between the negative terminal 12 and the ground are unbalanced, based on the first voltage data, the second voltage data and the third voltage data. The controller 240 may determine that the insulation condition between the positive terminal 11 and the ground and the insulation condition between the negative terminal 12 and the ground are unbalanced from each other, (i) if the difference between the voltage ($V_{(+)}$) represented by the first voltage data and the voltage ($V_{(-)}$) represented by the second voltage data is greater than or equal to the first threshold voltage, or (ii) if the difference between the sum (that is, $V_{(+)}+V_{(-)}$) of the voltage ($V_{(+)}$) represented by the first voltage data and the voltage ($V_{(-)}$) represented by the second voltage data and the pack voltage ($V_P$) is greater than or equal to the second threshold voltage. If the value of Step 420 is "YES", the process may proceed to Step 430. If the value of Step 420 is "NO", the process may proceed to Step 492.

In Step 430, the controller 240 commands the power supply 210 to apply the high-level voltage ($V_H$) between the first test port ($P_1$) and the second test port ($P_2$) during a predetermined period from the first time point.

In Step 440, the controller 240 records the current ($I_{D1}$) flowing through the first test port ($P_1$) within the predetermined period from the first time point as the first test current. The first test current is based on the current data from the current sensor 220.

In Step 450, the controller 240 determines whether the insulation condition between the battery pack 10 and the ground is faulty, based on the first test current. If the value of Step 450 is "YES", at least one of Step 460 and Step 490 is executed. If the value of Step 450 is "NO", Step 492 is executed.

In Step 460, the controller 240 commands the power supply 210 to apply the high-level voltage ($V_H$) between the third test port ($P_3$) and the second test port ($P_2$) for a predetermined period from a second time point. The second time point is a time point after a predetermined period passes since the first time point.

In Step 470, the controller 240 records the current ($I_{D2}$) flowing through the third test port ($P_3$) within a predetermined period from the second time point as the second test current. The second test current is based on the current data from the current sensor 220.

In Step 480, the controller 240 determines whether the insulation condition between the battery pack 10 and the ground is faulty, based on the second test current. If the value of Step 480 is "YES", Step 490 is executed. If the value of Step 480 is "NO", Step 492 is executed.

In Step 490, the controller 240 transmits the first reporting message to the external device 1.

In Step 492, the controller 240 transmits the second reporting message to the external device 1.

The embodiments of the present disclosure described above are not necessarily implemented by apparatuses and methods but may also be implemented through a program for realizing functions corresponding to the configuration of the present disclosure or a recording medium on which the program is recorded. Such implementation may be easily performed by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

What is claimed is:

1. An apparatus for diagnosing an insulation condition between a battery pack and a ground, comprising:
   a first resistor element electrically connected between a positive terminal of the battery pack and the ground; and
   a control circuit including a power supply and a controller operably coupled to the power supply,
   wherein the power supply includes a first test port electrically connected to the positive terminal and a second test port electrically connected to the ground and is configured to generate a high-level voltage,
   wherein the controller is configured to:
   command the power supply to apply the high-level voltage between the first test port and the second test port for a first predetermined period from a first time point, wherein the high-level voltage generates a first current flowing between the first test port and the second test port through the first resistor element;
   record the first current flowing through the first test port within the first predetermined period from the first time point as a first test current; and diagnose an insulation condition between the positive terminal of the battery pack and the ground, based on the first test current, wherein a first end of the first resistor element is connected between the positive terminal of the battery pack and the first test port of the power supply, and a second end of the first resistor element is connected between the second test port of the power supply and the ground.

2. The apparatus according to claim 1,
wherein the controller is configured to:
calculate a first test resistance by dividing the high-level voltage by the first test current; and
when the first test resistance is smaller than a first reference resistance by a first threshold resistance or more, output a first reporting message to an external device operably coupled to the controller through a communication channel, the first reporting message indicating that the insulation condition between the battery pack and the ground is faulty.

3. The apparatus according to claim 1, further comprising:
a second resistor element electrically connected between a negative terminal of the battery pack and the ground;
wherein the first resistor element and the second resistor element have a same resistance;
wherein the power supply further includes a third test port electrically connected to the negative terminal, and
wherein a first end of the second resistor element is connected between the second test port of the power supply and the ground, and a second end of the second resistor element is connected between the third test port of the power supply and the negative terminal of the battery pack.

4. The apparatus according to claim 3,
wherein the controller is configured to:
control the power supply to apply the high-level voltage between the third test port and the second test port for a second predetermined period from a second time point, wherein the high-level voltage generates a second current flowing from the third test port to the second test port through the second resistor element;
record the second current flowing through the third test port within the second predetermined period from the second time point as a second test current; and
diagnosing the insulation condition between the negative terminal of the battery pack and the ground, based on the second test current.

5. The apparatus according to claim 4,
wherein the controller is configured to:
calculate a second test resistance by dividing the high-level voltage by the second test current; and
when the second test resistance is smaller than a second reference resistance by a second threshold resistance or more, output a first reporting message to an external device operably coupled to the controller through a communication channel, the first reporting message indicating that the insulation condition between the battery pack and the ground is faulty.

6. The apparatus according to claim 3,
wherein the controller is configured to record a voltage between the first test port and the third test port as a pack voltage.

7. The apparatus according to claim 6,
wherein the high-level voltage is greater than ½ of the pack voltage.

8. The apparatus according to claim 6,
wherein the controller is configured to:

record a first test voltage between the first test port and the second test port while the power supply is in a sleep state;
record a second test voltage between the second test port and the third test port while the power supply is in the sleep state; and
determine whether a first insulation resistance between the positive terminal and the ground and a second insulation resistance between the negative terminal and the ground are in an unbalanced condition, based on the first test voltage, the second test voltage and the pack voltage.

9. A battery pack, comprising the apparatus according to claim 1.

10. A method for diagnosing an insulation condition between a battery pack and a ground by using an apparatus comprising:
a first resistor element electrically connected between a positive terminal of the battery pack and the ground; and
a control circuit including a power supply and a controller operably coupled to the power supply,
wherein the power supply includes a first test port electrically connected to the positive terminal and a second test port electrically connected to the ground and is configured to generate a high-level voltage, the method comprising:
by the controller, controlling the power supply to apply the high-level voltage between the first test port and the second test port for a first predetermined period from a first time point, wherein
the high-level voltage generates a first current flowing from the first test port to the second test port through the first resistor element;
by the controller, recording the first current flowing through the first test port within the first predetermined period from the first time point as the first test current; and
by the controller, determining whether the insulation condition between the positive terminal of the battery pack and the ground is faulty, based on the first test current,
wherein a first end of the first resistor element is connected between the positive terminal of the battery pack and the first test port of the power supply, and a second end of the first resistor element is connected between the second test port of the power supply and the ground.

11. The method according to claim 10, wherein the apparatus further includes a second resistor element electrically connected between a negative terminal of the battery pack and the ground, the method further comprising:
by the controller, controlling the power supply to apply the high-level voltage between a third test port included in the power supply and the second test port for a second predetermined period from a second time point, wherein the third test port is electrically connected to the negative terminal of the battery pack, and wherein the high-level voltage generates a second current flowing from the third test port to the second test port through the second resistor element;
by the controller, recording the second current flowing through the third test port within the second predetermined period from the second time point as a second test current; and by the controller, determining whether the insulation condition between the negative terminal of the battery pack and the ground is faulty, based on the second test current, wherein a first end of the second resistor element is connected between the second test port of the power supply and the ground, and a second end of the second resistor element is connected between the third test port of the power supply and the negative terminal of the battery pack.

12. The apparatus according to claim 1, wherein the first resistor element is positioned on an electrical line that electrically connects the positive terminal of the battery pack to the ground.

13. An electric vehicle, comprising the battery pack according to claim 9, wherein the ground is a chassis of the electric vehicle.

* * * * *